United States Patent [19]
Pascucci

[11] Patent Number: 5,854,762
[45] Date of Patent: Dec. 29, 1998

[54] PROTECTION CIRCUIT FOR REDUNDANCY REGISTER SET-UP CELLS OF ELECTRICALLY PROGRAMMABLE NON-VOLATILE MEMORY DEVICES

[75] Inventor: Luigi Pascucci, San Giovanni, Italy

[73] Assignee: SGS-Thomson Microelectronics, S.r.l., Milan, Italy

[21] Appl. No.: 961,368

[22] Filed: Oct. 30, 1997

[30] Foreign Application Priority Data

Oct. 30, 1996 [EP] European Pat. Off. .............. 96830553

[51] Int. Cl.$^6$ .................................................. G11C 16/06
[52] U.S. Cl. ................................ 365/185.04; 365/185.09
[58] Field of Search .................... 365/200, 195, 365/185.09, 185.04, 185.02

[56] References Cited

U.S. PATENT DOCUMENTS 5,301,161   4/1994   Landgraf et al. .................. 365/185.04
5,363,334  11/1994   Alexander et al. ................ 365/185.04

*Primary Examiner*—Son Mai
*Attorney, Agent, or Firm*—Michele A. Mobley; Jenkens & Gilchrist

[57] ABSTRACT

A protection circuit for electrically programmable non-volatile memory cells includes at least one first control circuit connected between first and second voltage references and having at least an input terminal and an output terminal wherein the output terminal delivers a reading/programming voltage signal to the cells. The protection circuit also includes at least one second control circuit having a first input terminal for receiving an enabling control signal, a second input terminal for receiving a Power-on-Reset signal, and an output terminal for supplying a control signal to the first input terminal of the first control circuit. The protection circuit further includes a disabling circuit connected between the first and the second voltage reference and having an output terminal connected to the first input terminal of the first control circuit. The disabling circuit comprises at least one redundant memory element connected between a translated voltage reference and the second voltage reference.

19 Claims, 3 Drawing Sheets

PROTECTION CIRCUIT FOR REDUNDANCY REGISTER SET-UP CELLS OF ELECTRICALLY PROGRAMMABLE NON-VOLATILE MEMORY DEVICES

BACKGROUND OF THE INVENTION

1. Field of the Invention

The present invention relates to a protection circuit for redundancy register set-up cells of electrically programmable non-volatile memories.

2. Discussion of the Related Art

Prior art memory devices often include redundancy structures to allow rows or columns of the memory matrix to be replaced when found faulty during testing. In particular, such redundancy structures are connected to set-up registers which contain faulty row/column addresses and corresponding redundant addresses.

Prior redundancy structures and set-up registers have included electrically blown fuses realized by means of non-volatile memory elements adapted to store redundancy and set-up information, as needed for operating the memory, in an unalterable manner. An electrically blown fuse comprises a suitably unbalanced latching structure which is connected between a first supply voltage reference Vdd and a second voltage reference, such as a signal ground GND, and is also connected to a set-up memory cell.

The redundancy register set-up cells comprise, MOS transistors in like set-up, and accordingly, are similar to the MOS transistors of the memory device. More specifically, a redundancy register set-up cell is substantially a non-volatile memory cell comprising a floating-gate MOS transistor. The floating gate is formed on a semiconductor substrate, and is separated therefrom by a thin layer of gate oxide. A control gate is coupled capacitively to the floating gate through a dielectric layer. Metal electrodes are provided to contact the drain, source, and control gate in order to apply predetermined voltage values to the memory cell. By suitably biasing the cell terminals, the amount of charge in the floating gate can be varied. The operation whereby charge is stored into the floating gate is called "programming phase", and comprises the biasing of the drain terminal and control gate to a predetermined value above the source terminal potential.

A non-volatile memory device provided with redundancy structures usually comprises a large number of such set-up cells. The set-up cells are organized into registers which store the address of a faulty line, row or column. Ideally, this redundant address should not be altered by changes in the register operating condition or by noise affecting the memory device as a whole.

The register has a first input node at a normally favored first logic level, or "0" level, and a second input node at an initially favored second logic level, or "1" level. The presence of a virgin non-volatile element on the node at the logic "1" level creates a conduction path which upsets the initial condition upon the voltage applied to the control gate of the non-volatile element attaining a suitable conductivity level of the element. Prior to the memory matrix testing phases, the set-up registers comprise virgin memory cells only. To store a redundant address, some of the virgin elements of a redundancy register are programmed, sometimes in an imperfect manner which is liable to wear.

When, normal levels of the register supply voltage Vdd are exceeded, set-up cells which have been only partially programmed may behave as virgin cells, thereby permanently altering the original redundancy set-up and irreversibly impairing its functionality. In fact, such partially programmed set-up cells, in the presence of even occasional high levels of the supply voltage Vdd, may trigger conduction paths that should have been cut off upon the programming phase of the cells and which blow off their corresponding electrically blown fuse in the set-up register.

Hence there is a need to have the set-up cells protected against possible overvoltages of the supply voltage, if malfunctioning of the memory device as a whole is to be prevented.

SUMMARY OF THE INVENTION

Accordingly, the present invention provides a protection circuit for redundancy register set-up cells of electrically programmable non-volatile memories, which has structural and functional features so as to allow the redundancy register set-up cells to be disconnected from the supply voltage reference, while neither introducing consumption of a static nature nor impairing the operation of the memory at the reading stage.

More specifically, the present invention provides a protection circuit for redundancy register set-up cells of electrically programmable non-volatile memories. The protection circuit comprises a first control circuit operably coupled between a first and a second voltage reference and comprising at least one input terminal and at least one output terminal, the output terminal adaptable to deliver a voltage signal to the cells. The protection circuit further comprises a second control circuit comprising a first input terminal for receiving an enabling control signal, a second input terminal for receiving a Power-on-Reset signal, and an output terminal for supplying a control signal to the input terminal of the first control circuit. The protection circuit further comprises a disabling circuit operably coupled between the first and second voltage reference and comprises an output terminal operably coupled to the input terminal of the first control circuit and at least one redundant memory element, the memory element operably coupled between a third voltage reference and the second voltage reference.

BRIEF DESCRIPTION OF THE DRAWINGS

The features and advantages of a protection circuit according to the invention will be apparent from the following description of an embodiment thereof, given by way of example and not of limitation with reference to the accompanying drawings.

DETAILED DESCRIPTION OF A PREFERRED EMBODIMENT

Figure 1:
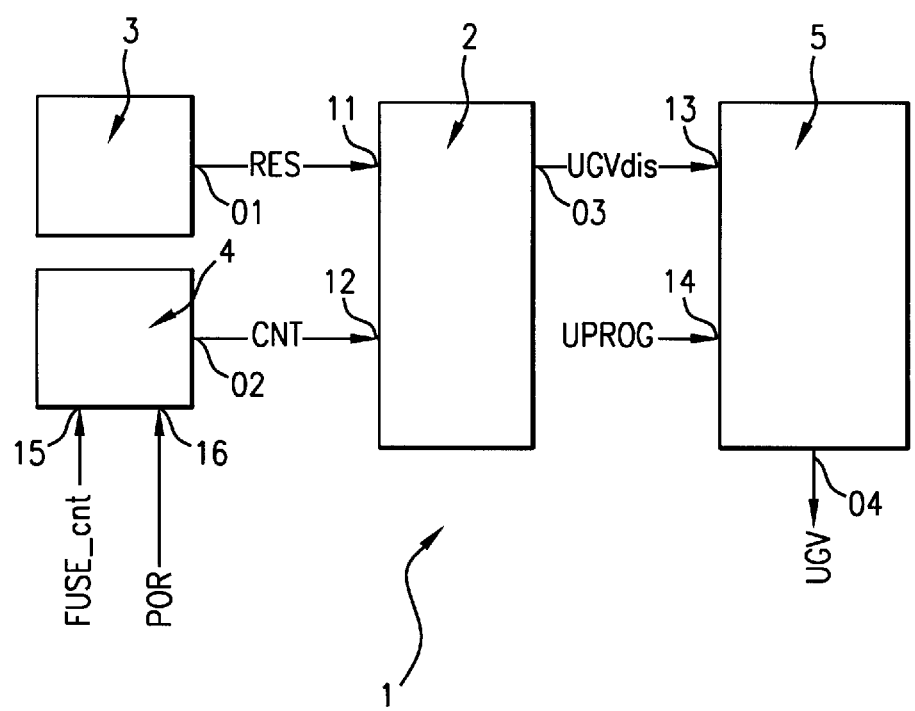
FIG. 1 is a schematic representation of a protection circuit realized according to this invention.

Referring now to FIG. 1, a schematic of a protection circuit 1 intended for set-up cells which are included in redundancy registers, e.g. cells of the UPROM type, is illustrated.

The protection circuit 1 comprises a bistable circuit 2 which is deliberately unbalanced and has an input terminal I1 connected to an output terminal O1 of a disabling circuit 3, an input terminal I2 connected to an output terminal O2 of a control circuit 4, and an output terminal O3 connected to an input terminal I3 of a control circuit 5. Control circuit 5 has input terminal I4 which receives a program enabling signal UPROG, and an output terminal O4 which delivers a reading voltage signal, and concurrently therewith a programming signal UGV, where required, to the set-up cells. Input terminal I3 of control circuit 5 receives a disabling signal UGVdis. In addition, control circuit 4 has input terminals I5 and I6 to respectively receive a control enabling signal FUSE_cnt and a Power-on-Reset signal POR, and delivers a control signal CNT on output terminal O2. Finally, output terminal O1 of disabling circuit 3 delivers a disabling signal RES.

Figure 2:
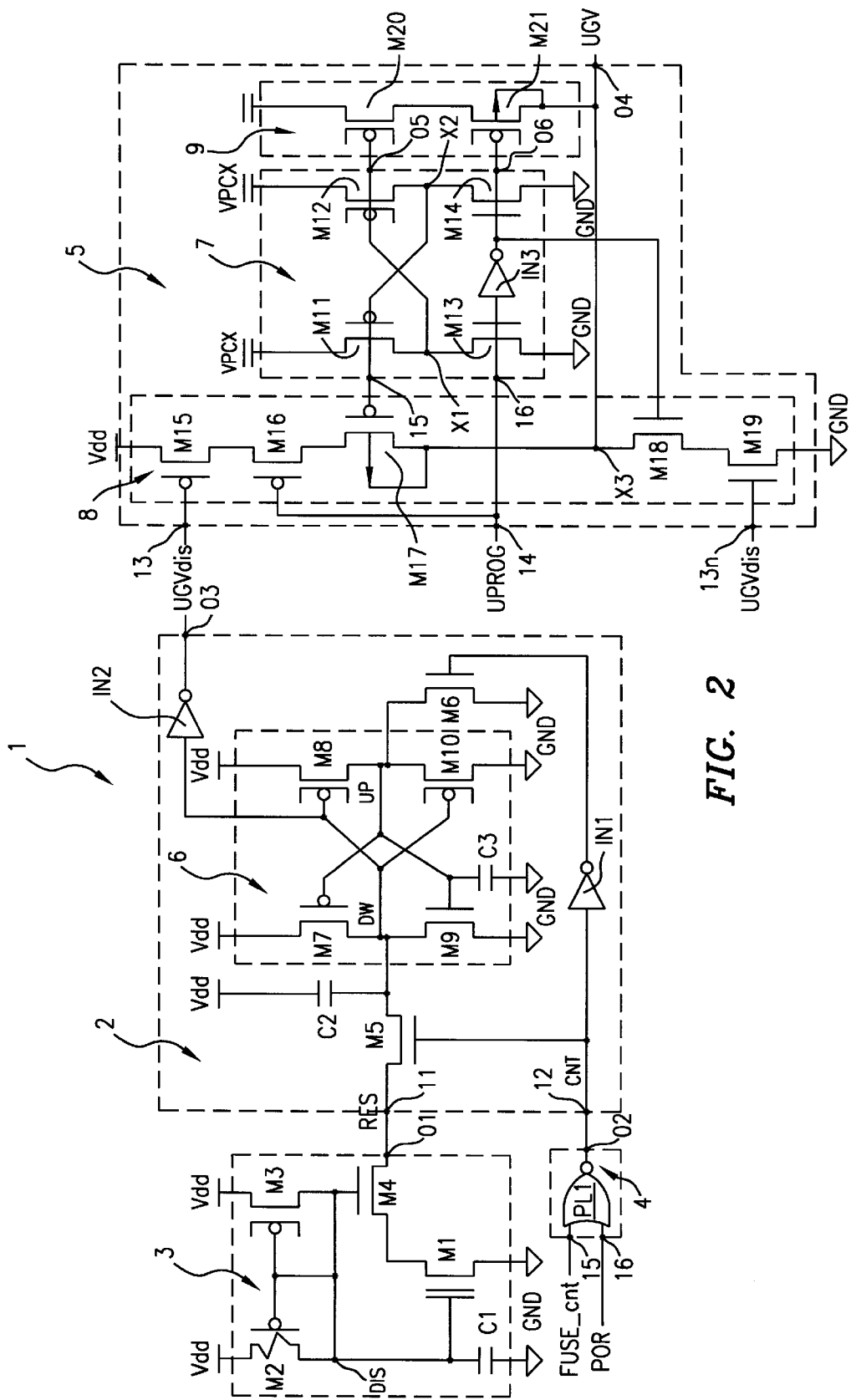
FIG. 2 is a further schematic view of the protection circuit of FIG. 1 in greater detail.

Referring now to FIG. 2, the circuit portions incorporated to protection circuit 1, will now be described with regard to their structural details. According to the invention, disabling circuit 3 advantageously includes a redundant memory element M1. More particularly, redundant memory element M1 of FIG. 2 is a floating-gate MOS transistor substantially similar to the memory cells which are connected to protection circuit 1, specifically to output terminal O4 of control circuit 5.

Disabling circuit 3 also includes a compensation transistor M2 and a pull-up transistor M3 connected to a first supply voltage reference Vdd. The transistors M2 and M3 are connected between the supply voltage reference Vdd and a translated supply voltage reference DIS. The control terminals are connected to each other, to their respective drain terminals, and to the translated supply voltage reference DIS. The disabling circuit 3 further includes a decoupling transistor M4 connected to output terminal O1 of disabling circuit 3 and to a second voltage reference, specifically a signal ground GND, via redundant memory element M1. Decoupling transistor M4 also has a control terminal connected to translated supply voltage reference DIS. In addition, disabling circuit 3 includes a capacitor C1 which is connected between translated supply voltage reference DIS and ground GND, and connected to control terminal of redundant memory element M1.

The compensation transistor M2 is a P-channel MOS transistor, or PMOS, with high resistivity, pull-up transistor M3 is a native type PMOS transistor, and decoupling transistor M4 is an N-channel MOS transistor, or NMOS.

Control circuit 4 comprises a logic gate PL1 which has input terminal I5 to receive the control enabling signal FUSE_cnt, input terminal I6 to receive the Power-on-Reset signal POR, and output terminal O2 delivering a control signal CNT and being connected to input terminal I2 of bistable circuit 2. The control enabling signal FUSE_cnt is operative to cut off protection circuit 1. In the embodiment shown in FIG. 2, logic gate PL1 is a NOR gate.

The bistable circuit 2 comprises a flip-flop 6 which is connected between supply voltage reference Vdd and ground GND and has an input terminal DW and an output terminal UP, respectively connected to input terminals I1 and I2 of bistable circuit 2. In particular, input terminal DW of flip-flop 6 is connected to input terminal I1 of bistable circuit 2 via an input transistor M5 which has a control terminal connected to input terminal I2 of bistable circuit 2. Also, input terminal DW of flip-flop 6 may optionally be connected to the supply voltage reference Vdd via a capacitor C2, thereby to enhance the flip-flop unbalance. Output terminal UP is connected to ground GND via output transistor M6 which has a control terminal connected to input terminal I2 of bistable circuit 2 via a logic inverter IN1.

Flip-flop 6 comprises transistors M7 and M8 connected between supply voltage reference Vdd and input terminal DW and output terminal UP, respectively, and comprises transistors M9 and M10 respectively connected between input terminal DW and output terminal UP and ground GND. In particular, transistors M7 and M9 have their control terminals connected together and to output terminal UP, as well as to ground GND through optional capacitor C3, while the transistors M8 and M10 have their control terminals connected together and to input terminal DW, as well as to output terminal O3 of bistable circuit 2 through a logic inverter IN2.

Input transistor M5 and output transistor M6 of bistable circuit 2 are NMOS transistors, transistor M7 of flip-flop 6 is a PMOS transistor, transistor M8 is a native PMOS transistor, transistor M9 is an NMOS transistor, and transistor M10 is a native NMOS transistor.

The control circuit 5 comprises a voltage booster circuit 7 connected between a programming voltage reference VPCX and ground GND, and to inputs I3, I4, I3n and output O4 terminals of control circuit 5, through an input decoupling circuit 8 and an output decoupling circuit 9.

In particular, booster circuit 7 includes transistors M11 and M12 which are connected between programming voltage reference VPCX and internal circuit nodes X1 and X2, and transistors M13 and M14 which are connected between internal circuit nodes X1 and X2 and ground GND, respectively. Furthermore, transistors M11 and M12 have their respective control terminals connected to internal circuit nodes X1 and X2, and their respective bulk terminals connected to input terminal I5 and output terminal O5 of booster circuit 7. Transistors M13 and M14 have their respective control terminals connected together through logic inverter IN3 and respective bulk terminals connected to input terminal I6 and output terminal O6 of booster circuit 7.

Input decoupling circuit 8 is connected between supply voltage reference Vdd and ground GND, and comprises a series of input decoupling transistors M15, M16, and M17, which are connected between the supply voltage reference Vdd and internal circuit node X3, and a series of input decoupling transistors M18 and M19 which are connected between internal circuit node X3 and ground GND. In particular, input decoupling transistor M15 has a control terminal connected to input terminal I3 of control circuit 5, input decoupling transistor M16 has a control terminal connected to input terminal I4, and input decoupling transistor M17 has a control terminal connected to input terminal I5 of booster circuit 7. Also, input decoupling transistor M18 has a control terminal connected to control terminal of transistor M14 of booster circuit 7, and input decoupling transistor M19 has a control terminal connected to a complementary input terminal I3n of control circuit 5.

Output decoupling circuit 9 is connected between programming voltage reference VPCX and output terminal O4 of control circuit 5, and comprises output decoupling transistors M20 and M21 which have respective control terminals connected to output terminals O5 and O6 of booster circuit 7.

Transistor M11 of booster circuit 7 is a PMOS transistor, transistor M12 is a native PMOS transistor, and transistors M13 and M14 are NMOS transistors. Also, input decoupling transistors of M15, M16 and M17 input decoupling circuit 8 are PMOS transistors, with transistor M17 being in particular in diode configuration, while input decoupling transistors M18 and M19 are NMOS transistors. Finally, output decoupling transistors M20 and M21 are native PMOS transistors.

The operation of protection circuit 1 according to the invention will now be described with reference in particular to the signal plots shown in FIG. 3.

Those skilled in the art will realize that protection circuit 1 is to be connected to a cell of an electrically programmable non-volatile memory device, specifically of the UPROM type, not shown in FIG. 1. Disabling circuit 3, which includes redundant memory element M1, responds in a similar manner to the memory cell having circuit 1 connected thereto, circuit 3 being identical with that cell and only generating disabling signal RES when it is actually needed.

Protection circuit 1 operates during the transient phase of application of the supply voltage to the memory device to be protected. In the presence of Power-on-Reset signal POR, bistable circuit 2 ("UPROM-like") is preset by the presence of a logic "0" level on its output terminal UP and a logic "1" level on its input terminal DW. Bistable circuit 2 is, moreover, isolated from the natural reset path of disabling circuit 3 by means of input transistor M5 being kept 'off' by the control signal CNT delivered by control circuit 4. At the end of the Power-on-Reset pulse, bistable circuit 2, being deliberately unbalanced, is no longer driven to the presetting condition, and is simultaneously connected to the reset path of disabling circuit 3 by signal RES.

According to the invention, while the redundancy register set-up memory cells are connected to supply voltage Vdd from the start, redundant memory element M1 of disabling circuit 3, being a repetition of such set-up cells, is applied translated supply voltage DIS as derived from supply voltage Vdd by pulling the drain terminal of pull-up transistor M3. Voltage DIS is only dynamically translated relatively to supply voltage Vdd. In fact, pull-up transistor M3 has a high conductivity that readily pulls capacitor C1 of disabling circuit 3, restricting its swing to below the supply voltage for a value equal to the threshold voltage of a native PMOS transistor, i.e. about −1.6 V. Thus, a value Vdd−Vth_pch_nat is obtained for the translated supply voltage.

Compensation transistor M2 has instead a lower threshold, of about −1.1 V, and is highly resistive. It only operates in the asymptotical end portion of the supply voltage pattern, so as to ensure that protection circuit 1 is triggered on even at minimal levels of the supply voltage. Accordingly, disabling circuit 3 is basically a repetition of the set-up cell to be protected, but is connected to translated supply voltage reference DIS. When translated supply voltage DIS meets the conditions for triggering on redundant memory element M1, disabling signal UGVdis is activated. In particular, decoupling transistor M4 of disabling circuit 3 is applied a voltage equal to supply voltage Vdd less the value of the threshold voltage Vth_pch_nat of PMOS transistor M3, which will couple input terminal DW of flip-flop 6 to translated supply voltage DIS being applied to redundant memory element M1.

When the translated supply voltage DIS reaches a value that will reverse flip-flop 6, bistable circuit 2 supplies disabling signal UGVdis to disable booster circuit 7 and lead the reading/programming voltage signal UGV to ground. In this way, the series of bistable circuit 2 and the control circuit 5 will function as a network driven by redundant memory element M1 to prevent overvoltages in supply voltage Vdd from being propagated to the memory cells, and ensure their proper operation.

It is noted that booster circuit 7 is, during normal operation of the memory device, in a reversed condition, since the memory cells to which it is connected are supplied voltage Vdd, which is higher than the voltage being applied to redundant memory element M1 and equal to Vdd−Vth_pch. Thus, protection circuit 1 realizes by itself that an initialization is being performed on the memory cells whereto it is connected. Furthermore, the booster circuit 7 is deliberately strongly unbalanced to prevent any incidental pulses.

With bistable circuit 2 being triggered on at fairly low levels of translated supply voltage DIS, the voltage to redundant memory element M1, by exceeding above that value and being precisely equal to DIS+Vth_pch_nat, will cut off the application of supply voltage Vdd to the set-up cells before it can attain dangerous levels.

At low supply levels, pull-up transistor M3 will be unable to trigger on redundant memory element M1. In this case, compensation transistor M2 is first operated which has a lower threshold and is suitably dimensioned to be highly resistive and, hence, very slow; redundant memory element M1 will therefore be triggered on at the level of translated supply voltage DIS which is closer to the supply voltage Vdd. Accordingly, the pulse will be spread more, and hold the supply voltage applied for a longer time. Lastly, at very low supply levels, the "leakage" phenomenon of compensation M2 and pull-up M3 transistors will operate to take the value of supply voltage Vdd to the memory cells which are connected to protection circuit 1, albeit at a very slow rate. In other words, compensation M2 and pull-up M3 transistors are effective to slow down transistors of protection circuit 1. This huge extension of the protection circuit triggering time does not endanger the redundancy registers and ensures that they are read correctly even at very low levels of supply voltage Vdd.

Keeping the operation of protection circuit 1 driven by supply voltage even at very low levels, albeit for a protracted time, is made possible by the provision of PMOS compensation M2 and pull-up M3 transistors, and by the utilization of the leakage current from their P junctions. It is important to observe that this pulling-up, though asymptotical of the supply voltage, is possible because of the translated supply voltage DIS node having no N-channel junctions connected to it. The "leakage" phenomenon, as tied to possible N-channel junctions, would indeed oppose the operation of compensation transistor M2, and therefore inhibit pulling-up to the supply voltage and, with it, triggering on protection circuit 1 at low levels of supply voltage.

The reversal of booster circuit 7 is self-compensated, in the sense that, at low levels of supply voltage, booster circuit 7 reversing would be retarded, whereas at high levels of the voltage, the operational condition would be advanced, thereby ensuring that the complete reading from the non-volatile memory elements can be carried out at all times.

Thus, the risk of resetting programmed cells is avoided, because reading voltage signal UGV is controlled in a self-compensated manner by disabling signal UGVdis driving a logic 0 level on signal UGV as soon as the memory device having protection circuit 1 applied to it can be regarded as fully read, based on that bistable circuit 2 would replicate its behavior. It can be stated, therefore, that protection circuit 1 as a whole is self-compensated relatively to supply voltage Vdd.

Programming voltage signal UGV is controlled by means of control circuit 5 being input the program enabling signal UPROG and allowing voltage UGV to be raised to the value of programming voltage VPCX (usually about 12 V). Under normal conditions, program enabling signal UPROG would be at a low logic level, or "0" level, and inhibit all programming activities, and input decoupling transistor M16 would be in the 'on' state.

With disabling signal UGVdis at the "0" level, input decoupling transistor M15 is 'on' and transistor M13 of booster circuit 7 is 'off'. In this way, the control terminal of transistor M14 of the booster circuit 7 will have its control terminal at a high logic level, or "1" level, and drives internal circuit node X2 to the "0" level, thereby turning off transistor M12 of booster circuit 7 and output decoupling transistor M20.

Under such conditions, the reading/programming voltage signal UGV will be following the supply voltage reference Vdd through input decoupling transistors M15, M16 and M17, presently all in the 'off' state. As disabling signal UGVdis goes to the 1 level, input decoupling transistor M15 is turned off, and input decoupling transistor M19 is turned on to drive a "0" level on reading/programming voltage signal UGV. Thus, input decoupling transistors M15, M16 and M17 control reading/programming voltage signal UGV for normal operation of the memory device to which protection circuit 1 is connected.

During the memory cell programming phase, program enabling signal UPROG goes to the "1" level, thereby driving internal circuit node X1 to the "0" level, and internal circuit node X2 to the "1" level. In this way, output decoupling transistors M20 and M21 will be turned on, and reading/programming voltage signal UGV connected to programming voltage reference VPCX, higher than supply voltage reference Vdd.

Output decoupling transistors M20 and M21 will then control the reading/programming voltage signal UGV during the programming operations of the memory device having the protection circuit 1 connected thereto.

According to the invention, transistor M12 of booster circuit 7 and output decoupling transistor M20 advantageously are of the native type, thus allowing protection circuit 1 to be slowed down during transients. This slowing down of protection circuit 1 guards the memory cells which are connected to the circuit from incidental programming, as due for example to sudden electrostatic charges, so that the behavior of the reading/programming voltage signal UGV remains unaffected by such charges. In addition, the slowed reading/programming voltage signal UGV avoids incidental alteration of the contents of the memory cells to which it is delivered. On the other hand, with the Power-on-Reset signal POR present, flip-flop 6 would be driven into a reverse condition and signal UGV would go to a high level substantially corresponding to supply voltage Vdd.

Bistable circuit 2 is similar in structure to the redundancy register set-up cells connected to protection circuit 1. Bistable circuit 2, which is repeating by construction the behavior of a redundancy register generic set-up cell, and control circuit 5 operate as one system to control reading/programming voltage signal UGV, thereby allowing the set-up cells to be applied supply voltage Vdd to a sufficient extent for them to be correctly read, and disabling this supply voltage as soon as a correct reading is obtained.

Protection circuit 1 of this invention improves the safety of the data in the memory cells connected to it even on the occurrence of fluctuations in the supply voltage during the reading phase. Thus, protection circuit 1 of this invention can set the time, level and extension of the reading/programming voltage signal UGV without using external signals or any special initial set-up.

Figure 3:
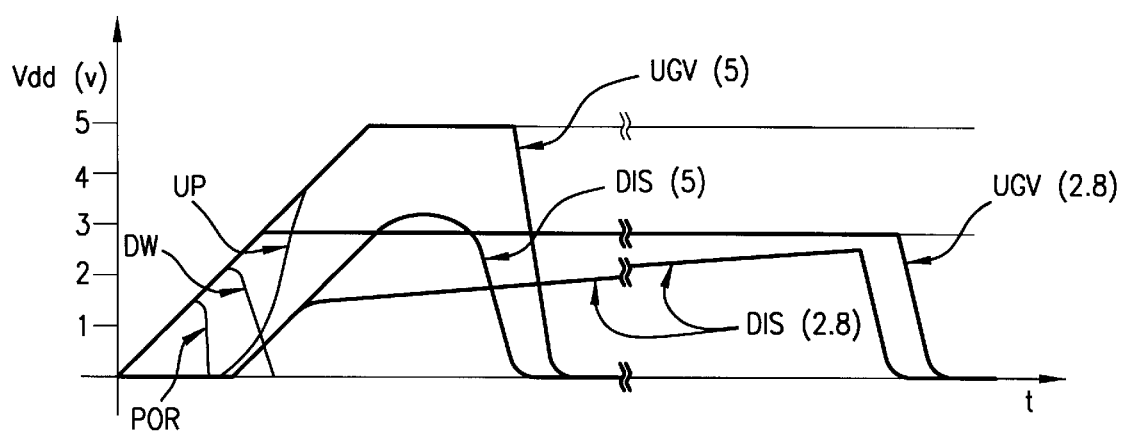
FIG. 3 shows plots vs. time of signals appearing in the protection circuit of FIG. 1.

Referring now to FIG. 3, the relationship between the time, level, and extension of UGV with the supply voltage Vdd will be illustrated.

The benefits brought about by the use of the protection circuit 1 of this invention, can be summarized as follows:

generation of a pulse reading/programming voltage signal UGV for the redundancy register set-up cells whereto protection circuit 1 is connected;

self-disconnection of such memory cells from the supply voltage once they have been read, only upon the redundant memory element M1 being triggered on;

inhibition of the propagation, through protection circuit 1 to the memory cells, of voltage spikes and high critical levels of supply voltage Vdd;

removal of any stress condition at high voltages from the memory cells to which protection circuit 1 is connected; and assurance of proper operation of the protection circuit 1 even at very low levels of the supply voltage.

It should be understood that changes and modifications may be made unto the protection circuit 1 according to the invention within the scope of the following claims.

Although the present invention and its advantages have been described in detail, it should be understood that various changes, substitutions and alterations can be made herein without departing from the spirit or scope of the invention as defined in the appended claims.

What is claimed is:

1. A protection circuit for redundancy register set-up cells of electrically programmable non-volatile memories, comprising:

a first control circuit, said first control circuit operably coupled between a first and a second voltage reference and comprising at least one input terminal and at least one output terminal, said output terminal adaptable to deliver a voltage signal to the cells;

a second control circuit, said second control circuit comprising a first input terminal for receiving an enabling control signal, a second input terminal for receiving a Power-on-Reset signal, and an output terminal for supplying a control signal to said input terminal of said first control circuit; and a disabling circuit, said disabling circuit operably coupled between said first and said second voltage reference and comprising an output terminal operably coupled to said input terminal of said first control circuit and at least one redundant memory element, said memory element operably coupled between a third voltage reference and said second voltage reference.

2. The protection circuit as recited in claim 1, wherein said disabling circuit further comprises at least one pull-up transistor operably coupled between said first voltage reference and said third voltage reference.

3. The protection circuit as recited in claim 1, wherein said redundant memory element comprises a control terminal operably coupled to said second voltage reference through a capacitor.

4. The protection circuit as recited in claim 2, further comprising a resistive compensation transistor, said resistive compensation transistor operably coupled between said first voltage reference and said third voltage reference, and including a control terminal operably coupled to a control terminal of said pull-up transistor and to said third voltage reference.

5. The protection circuit as recited in claim 1, further comprising a bistable circuit operably coupled between said first and said second voltage reference and including a first input terminal operably coupled to said output terminal of said disabling circuit, a second input terminal operably coupled to said output terminal of said second control circuit, an output terminal operably coupled to said input terminal of said first control circuit, at least one flip-flop element operably coupled between said first and said second voltage reference and operably coupled to said first input terminal, said second input terminal, and said output terminal of said bistable circuit.

6. The protection circuit as recited in claim 5, wherein said flip-flop element includes an input terminal operably coupled to said first input terminal of said bistable circuit through an input transistor, and to said first voltage reference through a capacitor and further includes an output terminal operably coupled to said second voltage reference through an output transistor having a control terminal operably coupled to said second input terminal of said bistable circuit.

7. The protection circuit as recited in claim 1, wherein said first control circuit further comprises a second input terminal for receiving a program enabling signal.

8. The protection circuit as recited in claim 7, wherein said first control circuit further comprises a voltage booster circuit operably coupled between a fourth voltage reference and said second voltage reference and operably coupled to said input terminal, to said second input terminal and to said output terminal of said first control circuit wherein said fourth voltage reference is at a higher level than said first voltage reference.

9. The protection circuit as recited in claim 2, wherein said pull-up transistor is a highly conductive, P-channel MOS transistor.

10. The protection circuit as recited in claim 4, wherein said compensation transistor is a highly resistive, P-channel MOS transistor.

11. The protection circuit as recited in claim 1, wherein said redundant memory element is a floating-gate MOS transistor.

12. The protection circuit as recited in claim 4, further comprising a decoupling transistor operably coupled between said output terminal of said disabling circuit and said redundant memory element and having a control terminal operably coupled to said third voltage reference.

13. The protection circuit as recited in claim 6, wherein said input transistor of said bistable circuit has a control terminal connected to said second input terminal of said bistable circuit, and said output transistor of said bistable circuit has a control terminal operably coupled to said second input terminal of said bistable circuit through a logic inverter.

14. The protection circuit as recited in claim 5, wherein said flip-flop element comprises first and second transistors operably coupled between said first voltage reference and input and output terminals of said flip-flop element, respectively, said flip-flop element further comprising third and fourth transistors operably coupled between said input and said output terminals of said flip-flop element, respectively, and said second voltage reference, said first and third transistors having control terminals connected together and to said output terminal, and to said second voltage reference through a capacitor, said second and fourth transistors having control terminals connected together, to said input terminal, and to said output terminal of said bistable circuit through a logic inverter.

15. The protection circuit as recited in claim 8, wherein said voltage booster circuit is operably coupled to said input terminal, said second input terminal, and to said output terminal of said first control circuit, respectively, through an input decoupling circuit operably coupled between said first and said second voltage reference, and an output decoupling circuit operably coupled between said fourth voltage reference and said output terminal of said first control circuit.

16. The protection circuit as recited in claim 15, wherein said voltage booster circuit comprises first and second transistors operably coupled between said fourth voltage reference and first and second internal circuit nodes, respectively, said voltage booster circuit further comprising third and fourth transistors operably coupled between said first and second internal circuit nodes and said second voltage reference, respectively, said first and second transistors having control terminals operably coupled to said first and second internal circuit nodes, and having bulk terminals operably coupled to a first input terminal and to a first output terminal of said voltage booster circuit, and said third and fourth transistors having control terminals operably coupled together through a logic inverter and having bulk terminals operably coupled to a second input terminal and to a second output terminal of said voltage booster circuit.

17. The protection circuit as recited in claim 16, wherein said input decoupling circuit comprises a series of first, second and third input decoupling transistors operably coupled between said first voltage reference and an internal circuit node, and a series of fourth and fifth input decoupling transistors operably coupled between said internal circuit node and said second voltage reference, said first, second and third input decoupling transistors having control terminals connected to said first and second input terminal of said first control circuit and to said first input terminal of said voltage booster circuit, said fourth and fifth input decoupling transistors having control terminals connected to said control terminal of said fourth transistor of said voltage booster circuit and to a complementary input terminal of said first control circuit.

18. The protection circuit as recited in claim 16, wherein said output decoupling circuit comprises first and second output decoupling transistors having control terminals operably coupled to said first and the second output terminal of said voltage booster circuit.

19. The protection circuit as recited in claim 18, wherein said first and said second output decoupling transistors are P-channel MOS transistors.

* * * * *